US012757804B2

(12) United States Patent
Sanna et al.

(10) Patent No.: US 12,757,804 B2
(45) Date of Patent: Oct. 6, 2026

(54) SEMICONDUCTOR DEVICE AND CORRESPONDING METHOD

(71) Applicant: STMicroelectronics S.r.l., Agrate Brianza (IT)

(72) Inventors: Aurora Sanna, Milan (IT); Cristina Somma, Cinisello Balsamo (IT); Damian Halicki, Agrate Brianza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 420 days.

(21) Appl. No.: 18/386,069

(22) Filed: Nov. 1, 2023

(65) Prior Publication Data

US 2024/0145364 A1 May 2, 2024

(30) Foreign Application Priority Data

Nov. 2, 2022 (IT) ........................ 102022000022428

(51) Int. Cl.

| | |
|---|---|
| ***H10W 90/00*** | (2026.01) |
| ***H10W 20/20*** | (2026.01) |
| ***H10W 20/41*** | (2026.01) |
| ***H10W 70/65*** | (2026.01) |

(52) U.S. Cl.

CPC ......... *H10W 90/701* (2026.01); *H10W 20/20* (2026.01); *H10W 20/427* (2026.01); *H10W 70/65* (2026.01)

(58) Field of Classification Search

CPC . H10W 90/701; H10W 20/20; H10W 20/427; H10W 70/65; H10W 72/00

See application file for complete search history.

(56) References Cited

U.S. PATENT DOCUMENTS

| | | | | |
|---|---|---|---|---|
| 9,184,123 | B1 * | 11/2015 | Liu | H10W 90/701 |
| 9,461,000 | B2 * | 10/2016 | DeLaCruz | H10W 70/611 |
| 10,362,676 | B1 * | 7/2019 | Nakamoto | H05K 1/0265 |
| 11,121,072 | B1 * | 9/2021 | Zhu | H10W 20/432 |

(Continued)

FOREIGN PATENT DOCUMENTS

| | | | | |
|---|---|---|---|---|
| CN | 114730756 A | * 7/2022 | | H10W 90/00 |
| CN | 114730756 B | * 11/2024 | | H10W 90/00 |

(Continued)

OTHER PUBLICATIONS

IT Search Report and Written Opinion for priority application, IT Appl. 102022000022428, report dated May 10, 2023, 8 pgs.

*Primary Examiner* — Laura M Menz

(74) *Attorney, Agent, or Firm* — Crowe & Dunlevy LLC

(57) ABSTRACT

A BGA package includes an array of electrically conductive balls providing electrical contact for a semiconductor die. A power channel is provided to convey power supply current towards the semiconductor die. The power channel is formed by a stack of electrically conductive planes. The electrically conductive planes are stacked in a stepped arrangement wherein a number of stacked planes in each step of the stack increases in a direction from a distal end to a proximal end of the power channel. Adjacent electrically conductive planes in the stack of the power channel are electrically coupled with electrically conductive vias extending therebetween. Current conduction paths towards the die area thus have resistance values that decrease from the distal end to the proximal end of the power channel.

10 Claims, 8 Drawing Sheets

(56) References Cited

U.S. PATENT DOCUMENTS

| | | | | |
|---|---|---|---|---|
| 11,948,807 | B2 * | 4/2024 | Doyle | H10W 70/092 |
| 11,990,442 | B2 * | 5/2024 | Somma | H10W 20/435 |
| 2012/0068322 | A1 * | 3/2012 | Hanabe | H10W 70/635<br>257/676 |
| 2015/0108604 | A1 * | 4/2015 | Nakamura | H10W 20/20<br>257/532 |
| 2015/0313006 | A1 * | 10/2015 | Lane | H05K 1/0216<br>174/250 |
| 2015/0364438 | A1 * | 12/2015 | Xu | H10W 72/00<br>228/41 |
| 2016/0197053 | A1 * | 7/2016 | Kline | H05K 1/11<br>228/264 |
| 2018/0184514 | A1 * | 6/2018 | Yamada | H05K 1/0213 |
| 2020/0365544 | A1 * | 11/2020 | Chen | G02B 6/30 |
| 2022/0173064 | A1 * | 6/2022 | Somma | H10W 20/435 |
| 2022/0319867 | A1 * | 10/2022 | Doyle | H10W 70/092 |
| 2024/0145364 | A1 * | 5/2024 | Sanna | H10W 72/00 |
| 2025/0393117 | A1 * | 12/2025 | Shaik | H05K 1/0216 |

FOREIGN PATENT DOCUMENTS

| | | | | | |
|---|---|---|---|---|---|
| CN | 121665586 | A | * | 3/2026 | H10W 90/00 |
| EP | 4009365 | A1 | * | 6/2022 | H10W 20/427 |
| EP | 4365944 | A1 | * | 5/2024 | H10W 70/65 |
| IT | 202000029210 | A1 | * | 10/2024 | |
| IT | 102022000022428 | B1 | * | 10/2024 | |
| JP | 2012009717 | A | * | 1/2012 | H10W 20/216 |
| JP | 2018107307 | A | * | 7/2018 | H05K 1/116 |
| JP | WO2018180235 | A1 | * | 2/2020 | H05K 3/36 |
| KR | 20220165132 | A | * | 12/2022 | H10W 70/09 |
| WO | WO-2013098929 | A1 | * | 7/2013 | H10W 90/701 |
| WO | WO-2018180235 | A1 | * | 10/2018 | H10W 90/00 |
| WO | WO-2022103539 | A1 | * | 5/2022 | H10W 70/05 |

* cited by examiner

SEMICONDUCTOR DEVICE AND CORRESPONDING METHOD

PRIORITY CLAIM

This application claims the priority benefit of Italian Application for Patent No. 102022000022428 filed on Nov. 2, 2022, the content of which is hereby incorporated by reference in its entirety to the maximum extent allowable by law.

TECHNICAL FIELD

The description relates to semiconductor devices.

One or more embodiments can be applied to semiconductor devices comprising BGA (Ball Grid Array) packages.

One or more embodiments can be applied to high-power BGA package designs in wire-bond and flip-chip configurations.

BACKGROUND

Increasingly strict current management specifications apply to high-end digital products, which may result in various issues at the package and printed circuit board (PCB) level.

For instance, increasing DC current levels on digital devices suggest specific design solutions in BGA packages.

A so-called power channel structure may be resorted to in order to facilitate current distribution at the PCB level, for instance, by facilitating distributing power (current) from the outer periphery to the inner power balls located at the die area of the BGA substrate, just below the semiconductor chip or die.

At package level, depending on current flow direction, certain balls in the array can be traversed by an excessive current, which may give rise to electromigration issues: the current tends to flow through the outermost balls that are closer to the voltage regulator causing a critical bottleneck.

Uniform plane connection thus reduces the maximum acceptable current because of the non-uniform current distribution at the ball level.

There is a need in the art to contribute in overcoming the drawbacks outlined in the foregoing.

SUMMARY

One or more embodiments may relate to a semiconductor device.

One or more embodiments may relate to a corresponding method.

Solutions as described herein are based on a power channel design solution that provides a (progressively) decreasing ball-to-die resistance by exploiting the full 3D geometry of the power supply connection made of a stack of planes on multiple layers connected, e.g., by vias in the vertical direction.

In solutions as described herein, given a number "n" of plane layers assigned to a same power supply, a stepped structure is realized having a maximum number of "n" steps.

In solutions as described herein, at the lowest layer (closest to a support member such as a printed circuit board, PCB) the plane is extended over all the channel balls, from the package edge to the die area; moving to upper layers (closer to the die), the power plane dimensions are progressively reduced, excluding the area above the most external balls.

In solutions as described herein, adjacent (superposed) planes are connected via arrays of vias, distributed in a regular structure that follows the position of the balls.

In solutions as described herein, the rows in the via structures are progressively reduced from bottom to top, following the plane shapes.

In solutions as described herein, the number of vias can change based on the expected current level to be carried.

Solutions as described herein thus provide a device package including a power channel exhibiting steps in vertical direction, forming a progressively decreasing resistance path towards the die.

BRIEF DESCRIPTION OF THE DRAWINGS

One or more embodiments will now be described, by way of example only, with reference to the annexed figures, wherein.

DETAILED DESCRIPTION

Corresponding numerals and symbols in the different figures generally refer to corresponding parts unless otherwise indicated.

The figures are drawn to clearly illustrate the relevant aspects of the embodiments and are not necessarily drawn to scale.

The edges of features drawn in the figures do not necessarily indicate the termination of the extent of the feature.

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The headings/references used herein are provided merely for convenience and hence do not define the extent of protection or the scope of the embodiments.

Throughout the figures, like parts and elements are indicated with like references so that a detailed description will not be repeated for each and every figure for brevity.

Figure 1:
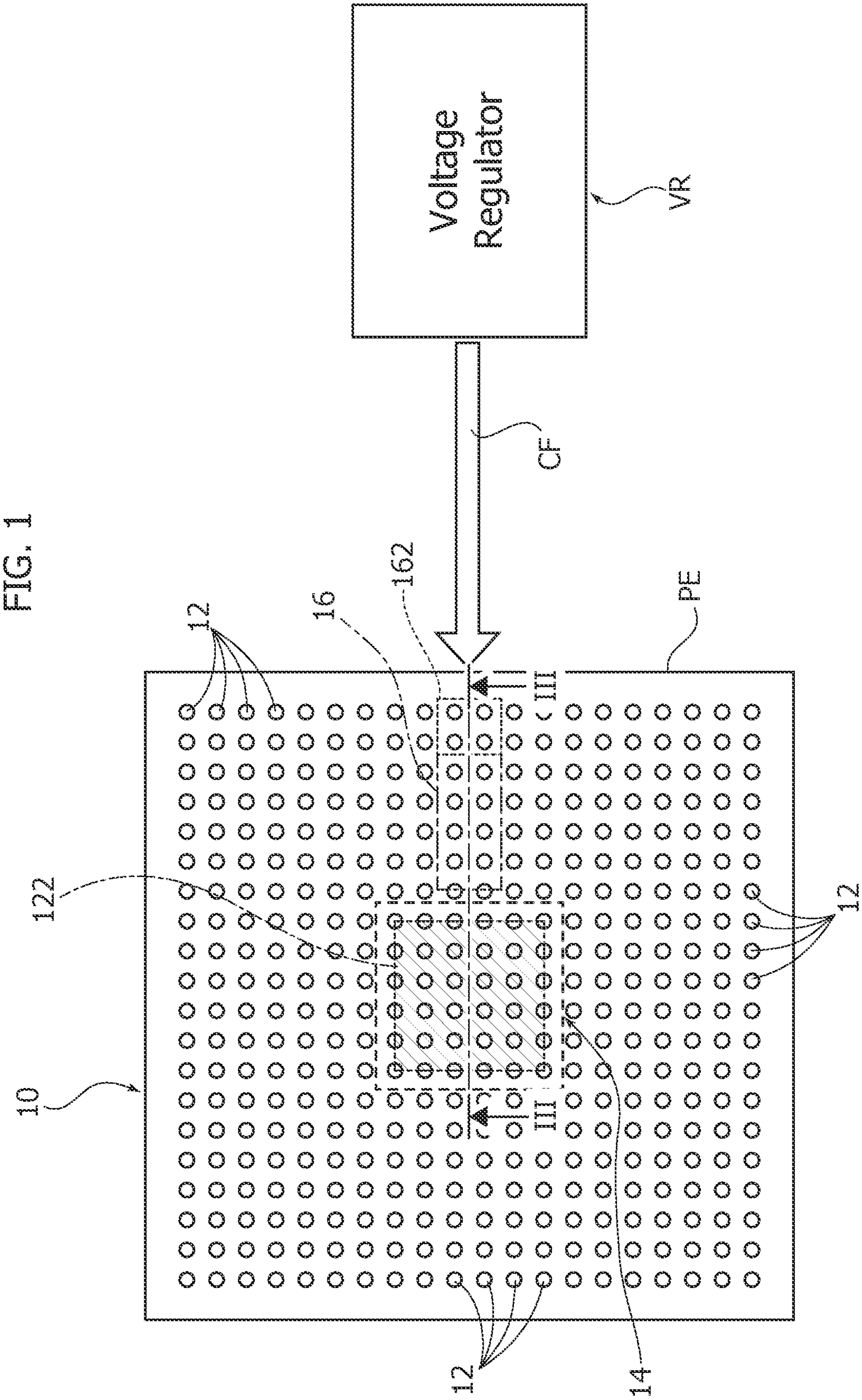
FIG. 1 is a plan view of a Ball Grid Array (BGA) package exemplary of a possible context of use of solutions as described herein.

FIG. 1 is an exemplary plan view from the rear or bottom surface of a conventional BGA (Ball Grid Array) of a semiconductor device package 10 including an array of spherical contacts or "balls" 12. The balls provide electrical connections for an (integrated circuit) semiconductor chip or die attached at a die area 14 facing the top or front side of the package 10. The outline of such a chip or die is shown in dashed lines in FIG. 1.

Throughout this description "chip" and "die" will be used as synonyms.

Figure 2A:
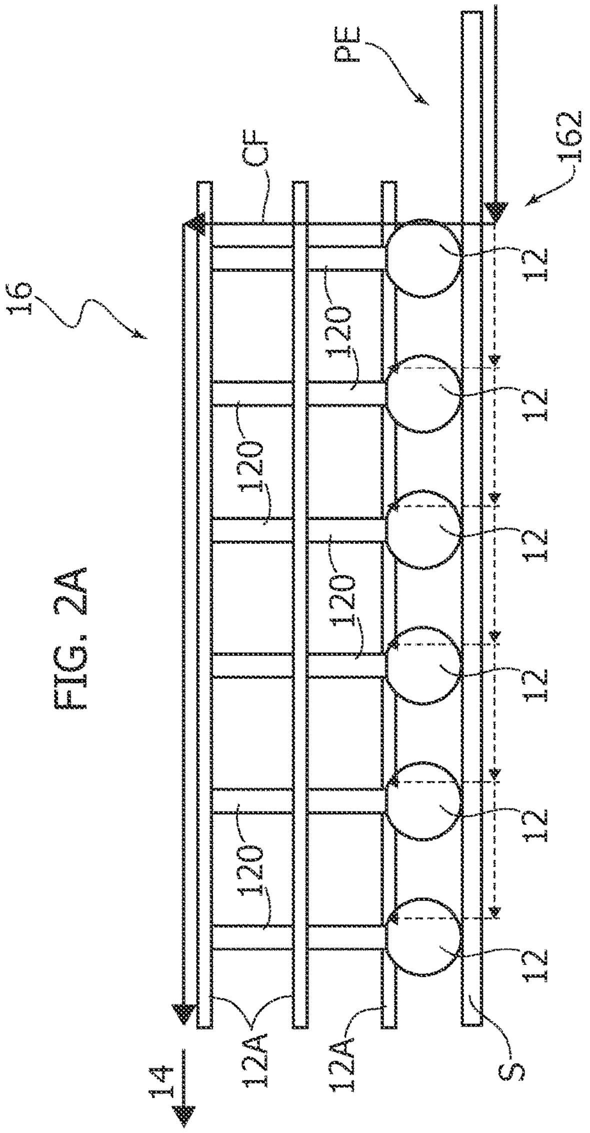
FIGS. 2A and 2B are schematic representations exemplary the principle underlying solutions as described herein (FIG. 2B) in comparison with conventional solutions (FIG. 2A)
Figure 2B:
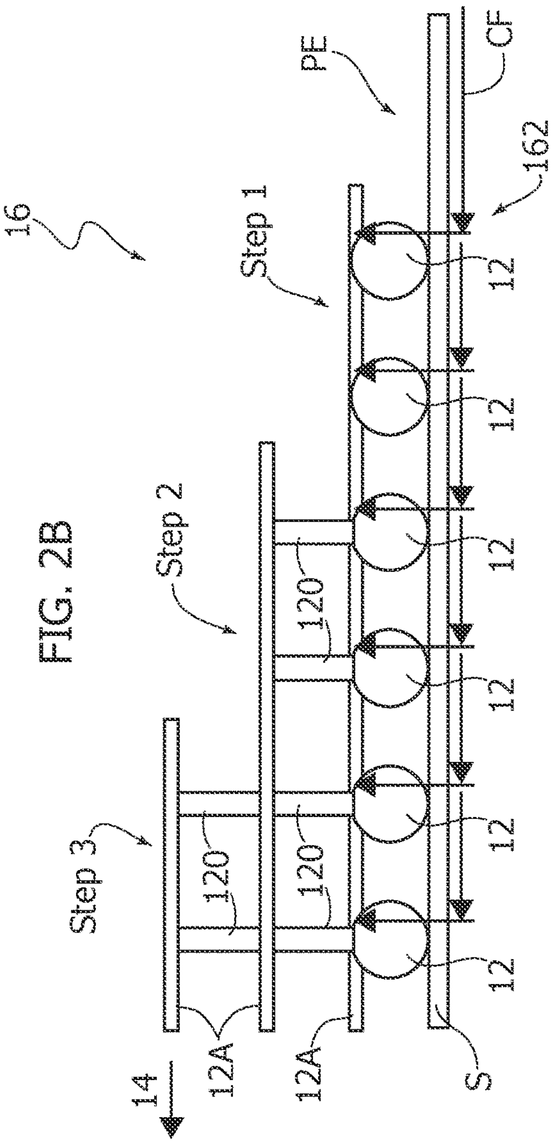

The ball array is intended to facilitate mounting the package 10 onto a substrate S (such as a printed circuit board or PCB—see FIGS. 2A and 2B, for instance).

Power supply to the semiconductor chip or die in the package 10 can be provided via a voltage regulator VR (possibly hosted on the PCB) with a current flow CF from the peripheral edge PE of the package 10 to the die area 14 (that is, the area where the die is mounted).

A so-called power channel structure 16 may be resorted to in order to facilitate a uniform current distribution among the power channel balls, from the periphery to the center of the package.

A power channel 16 includes a subset of balls 12 which are coupled to a common electrically conductive structure on the package side and to an electrically conductive formation on the substrate S that is in turn coupled to the power supply source (voltage regulator) VR providing the supply current CF.

Such a solution is otherwise conventional in the art, which makes it unnecessary to provide a more detailed description herein.

It is noted that the current CF tends to flow (mostly) through the "outermost" balls in the power channel 16 which, as indicated by 162 in FIG. 1, are closer to the package edge PE and thus to the voltage regulator VR causing a critical bottleneck.

The mechanism underlying this (undesired) phenomenon can be understood by referring to FIG. 2A.

FIG. 2A can be regarded essentially as an enlarged (cross-sectional) view of a portion of a power channel 16 between, by way of example, a row of 6 (six) balls 12 each electrically coupled with a set of uniform plane connections 12A towards the die area 14. As illustrated, the planes 12A are connected through "vertical" vias 120.

In a solution as presented in FIG. 2A, conduction of current CF from the voltage regulator VR to the die area 14 occurs via a resistive network comprising: the resistances of electrically conductive formations or tracks extending between adjacent pairs of balls 12 at the top or front surface of the substrate S onto which the package 10 is mounted via the balls 12; the resistances of the balls 12 in the power channel 16, with these balls located between the top or front surface of the substrate S and the bottom of back surface of the package 10 (Z-axis); and the resistances of the portions of the conductive planes 12A providing connections between adjacent pairs of balls 12 in the power channel 16.

As discussed in Unites States Patent Application Publication No. 2022/0173064 A1 (corresponding to EP 4,009,365 A1 and incorporated herein by reference), even without specific calculations it is noted that the current CF will tend to follow the shortest path (having the lowest resistance value) through the "outermost" balls 162, that is those balls 12 nearest to the voltage regulator VR (on the right-hand side of FIG. 2A).

To summarize: the absence of a power channel at the package level introduces in any case a risk of current bottlenecks at the substrate (e.g., PCB level); and uniform conductive planes 12A for the connection of power channel balls at the package level (see FIG. 2A) reduce the maximum acceptable current because of the non-uniform current distribution at the ball level.

A possible approach in addressing those issues involves selectively decreasing the resistance of the current flow paths through the balls 12 (lands) to the die area 14.

For instance, one may rely on the concept of making the shortest path (or more generally, the shorter paths closer to the voltage regulator VR) more resistive in order to redistribute more uniformly the current CF over all the balls 12 coupled to the power channel 16.

Such an approach, intended to facilitate a uniform distribution of the power supply current CF over the length of a power channel, is discussed in Unites States Patent Application Publication No. 2022/0173064.

Adopting (for simplicity and ease of understanding) the same references already introduced in FIGS. 1 and 2A herein, those earlier documents disclose a semiconductor device comprising an (integrated circuit) semiconductor die mounted at a die area 14 of a package 10 such as a BGA package with an array of electrically conductive balls 12 providing electrical contact for the semiconductor die.

A power channel 16 is provided to convey a power supply current CF to the semiconductor die at the area 14. The power channel 16 comprises one or more electrically conductive planes 12A extending in a longitudinal direction of the electrically conductive plane(s) between a distal end at the periphery PE of the package 10 and a proximal end at the die area 14 of the package 10 as well as a distribution of electrically conductive balls 12 distributed along a longitudinal direction of the electrically conductive plane 12A.

The electrically conductive planes 12A comprise subsequent portions in the longitudinal direction between adjacent electrically conductive balls 12. These subsequent portions have respective electrical resistance values, which are monotonously decreasing (Rshape_8<Rshape_7<Rshape_6<Rshape_5<Rshape_4<Rshape_3<Rshape_2<Rsha 1) from the distal end to the proximal end of the electrically conductive plane 12A.

In that way, instead of flowing primarily, if not exclusively, through the balls 162 (the balls 12 in the power channel 16 nearest to the periphery of the package 10), the current CF will be distributed more uniformly in such a way that the various pairs of balls 12 in the power channel 16, including the pairs nearest to the power balls 122 and the area of the die 14 will carry more evenly distributed fractions of the current CF.

In the solutions disclosed in Unites States Patent Application Publication No. 2022/0173064 A1 (EP 4,009,365 A1) such a result is obtained, for instance, by varying the width of a conductive plane 12A providing the connection so that this is narrowest at the "peripheral" balls 12 and becomes gradually larger towards the "inner" balls in the power channel 16, that is the balls nearest the power balls 122 and area of the die 14.

Stated otherwise, Unites States Patent Application Publication No. 2022/0173064 A1 (EP 4,009,365 A1) disclose solutions where a conductive plane 12A connection exhibits a flared shape going from the periphery PE to the central portion 14 of the package 10 and a tapered shape going from the central portion 14 to the periphery PE of the package 10, relying on the well-known principle that the resistance of a conductor is inversely proportional to its cross-sectional area and directly proportional to its length.

While satisfactory, that solution was found to be suited for further improvement taking advantage of package geometry.

Solutions as described herein again apply to semiconductor devices 10 comprising a semiconductor die mounted at a die area 14 of a device package with an array of electrically conductive balls 12 providing electrical contact for the semiconductor die 14.

Solutions as described herein again include (at least) one power channel 16 to convey power supply current CF to the die area 14.

The power channel 16 extends between a distal end at the periphery (peripheral edge PE) of the package 10 and a proximal end at (e.g., under) the die area 14.

In solutions as described herein, the power channel 16 comprises a stack of electrically conductive planes 12A between a current inflow plane (FIG. 2B, bottom) opposite the die area 14 and a current outflow plane (FIG. 2B, top) towards the die area 14 of the package.

A distribution of electrically conductive balls 12 is provided comprising electrically conductive balls coupled to the current inflow plane (FIG. 2B, bottom) of the power channel 16.

The power channel 16 thus provides current conduction paths towards the die area 14 of the package for electrically conductive balls 12 in the distribution of electrically conductive balls 12 coupled to the current inflow plane of the power channel 16.

Solutions as described herein are based on the concept exemplified in FIG. 2B, wherein a balanced current distribution is pursued by increasing—thanks to a stepped (staircase-like) structure—the resistance of the "preferred" path (s) that the current CF would tend to follow.

In that way, the current CF is more evenly distributed over the current conduction paths towards the die area 14 through the balls 12.

In solutions as described herein, adjacent electrically conductive planes 12A in the power channel 16 are electrically coupled with electrically conductive vias 120 extending between the planes, and the planes 12A in the power channel 16 are stacked in a stepped arrangement: the number of stacked planes 12A increases in steps in the direction from the distal end (peripheral edge PE) to the proximal end of the power channel 16 (at the die area 14) so that the current conduction paths towards the die area 14 have resistance values that decrease from the distal end to the proximal end of the power channel 16.

Advantageously, the electrically conductive planes 12A in such a stack extend over respective lengths in the direction from the distal end PE to the proximal end of the power channel 16 and these respective lengths decrease going from the current inflow (bottom) plane towards the current outflow (top) plane of the power channel 16.

The proposed power channel design solution realizes a progressively decreasing ball-to-die (die area 14) resistance exploiting the full 3D geometry of the power supply connection, made of planes 12A stacked in multiple layers connected by vias 120 in the "vertical" direction as exemplified in FIG. 2B.

Given a number "n" of layers of conductive planes 12A assigned to a same power supply VR, a stepped layer structure can be realized having a maximum number of "n" steps.

For instance (and merely by way of example), FIG. 2B shows three layers of conductive planes 12A assigned to a same power supply VR and arranged in a stepped structure having three steps or levels.

In such a stepped structure: the lowest (current inflow) layer or level (Step 1, closest to the substrate S) extends over all the power channel balls 12, from the package edge PE (at the right-hand side of the figure) towards the die area 14, and in the upper layers or levels (see Step 2 and Step 3, closer to the die area 14), the power plane dimensions (lengths) are progressively reduced, gradually excluding areas above the most external balls.

In a stepped structure as exemplified in FIG. 2B, observed going from right to left (that is, in the direction from the peripheral edge PE towards the die area 14): the number of vertically stacked conductive planes increases (first only one conductive plane 12A in Step 1, then two conductive planes 12A in Step 2, and finally three conductive planes in Step 3); and the lengths of the conductive planes decreases (with the top, current outflow plane near the die area 14 shorter than the underlying conductive plane 12A, which is in turn shorter than the bottom, current inflow conductive plane coupled to the balls 12.

Adjacent superposed conductive planes 12A are connected by arrays of vias 120 distributed in a regular (e.g., columnar) structure that follows the position of the balls.

The number of interconnecting vias 120 between adjacent superposed conductive planes 12A is progressively reduced from bottom to top, following the shapes of the conductive planes.

The number of interconnecting vias 120 between adjacent superposed conductive planes 12A can thus be changed and adapted to the expected current level to be carried.

A solution as exemplified in FIG. 2B facilitates a controlled current distribution on BGA power channel balls.

Figure 3:
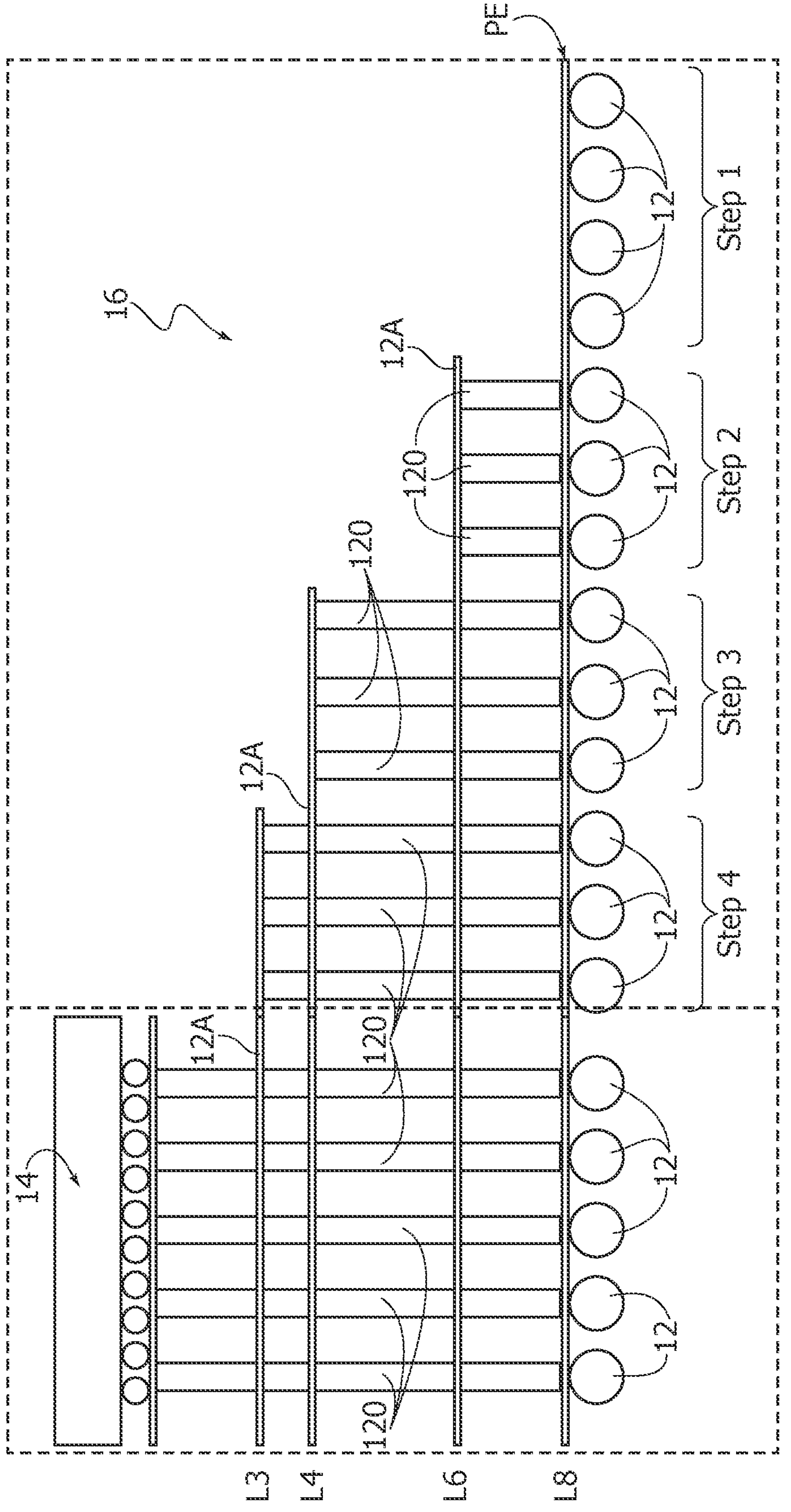
FIG. 3 is a cross-sectional view along line of FIG. 1 exemplary of the principle underlying solutions as described herein.

Such a multi-layer conductive plane structure is applicable to a variety of substrate stack-up arrangements and materials without additional manufacturing and assembly processes involved FIG. 3 (again, this can be regarded essentially as a vertical cross-section through a power channel 16 as illustrated in FIG. 1) shows a generic stack of x layers of electrically conductive material (a metal such as copper, for instance) where n layers L3, L8, L6, L8 are dedicated to power planes in the power channel 16 ($n<x$).

In the (exemplary) solution of FIG. 3: a first step (Step 1) in the stepped structure is defined (at the right-hand side of the figure) by the rightmost portion of the current inflow layer L8 that extends over all the power channel balls 12, from the package edge PE towards the die area 14; a second step (Step 2) in the stepped structure is defined by the rightmost portion of the layer L6 that extends towards the die area 14 over the power channel balls 12 excluding the (four, in the example shown) balls nearer the package edge PE; a third step (Step 3) in the stepped structure is defined by the rightmost portion of the layer L4 that extends towards the die area 14 over the power channel balls 12 excluding the (seven, in the example shown) balls nearer to the package edge PE; and a fourth step (Step 4) in the stepped structure is defined by the rightmost portion of the layer L3 that extends towards the die area 14 over the power channel balls 12 excluding the (ten, in the example shown) balls nearer the package edge PE.

Again, in a stepped structure as exemplified in FIG. 3, observed going from right to left (that is, in the direction from the peripheral edge PE towards the die area 14): the number of stacked conductive planes increases (first only conductive plane L8 Step 1, then conductive planes L8 and L6 in Step 2 and conductive planes L8, L6 and L4 in Step 3; and finally conductive planes L8, L6, L4 and L3 in Step 4); the lengths of the conductive planes decreases (with the conductive plane L3 nearest to the die area 14 shorter than the underlying conductive plane L4; this is in turn shorter than the conductive plane L6 which is shorter than the bottom, current inflow conductive plane L8 coupled to the balls 12.

This solution does not involve specific limitations on the layer choice, that depends on overall layout constraints.

In a solution as exemplified in FIG. 3 the outermost balls 12 in the package, near the peripheral edge PE, "see" a higher resistance towards the die area 14 than the innermost balls 12 (under the die area 14), with such resistance decreasing progressively as more parallel electrical conduction paths (levels of conductive planes 12A and vias 120) are added in the additional steps.

It is otherwise noted that in the examples presented herein the current transfer from the package to the die is assumed to occur at the uppermost layer L1, where the die is mounted. In certain embodiments, the power channel may not be extended to L1, but a connection to L1 is present below the die area.

Figure 4:
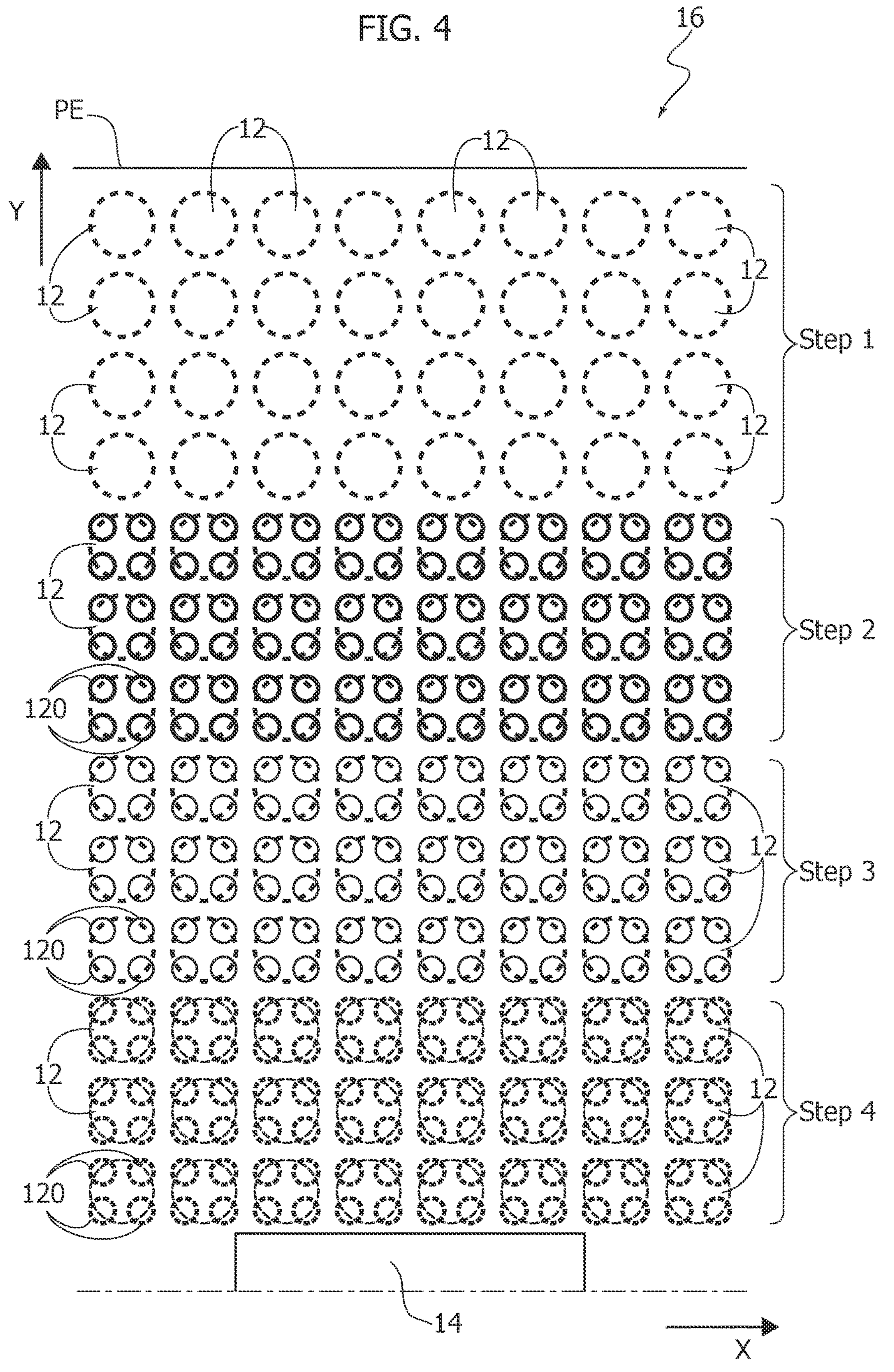
FIG. 4 is a plan view of a power channel according to solutions as described herein that may be included in a BGA package as exemplified in FIG. 1.

The concept exemplified in FIG. 3 is further illustrated in FIG. 4.

In FIG. 4 (essentially a plan view of the power channel 16 of FIG. 3 extending between the package edge PE and the die area 14) Step 1 is again visible with a conductive plane on level L8 and no vias.

Step 2 is likewise visible with conductive planes on levels L8-L6 and vias 120 between L8-L6, along with Step 3 with conductive planes on levels L8-L6-L4 and vias 120 between levels L8-L6 and L6-L4 and Step 4 with conductive planes on levels L8-L6-L4-L3 and vias 120 between levels L8-L6, L6-L4, and L4-L3.

A combination of blind/buried vias 120 can be adopted to connect the conductive planes.

The number of balls 12 (and rows) can be varied both in the X direction (across the power channel 16) and in the Y direction (lengthwise of the power channel 16) taking into account desired current levels and possible layout constraints.

Via structures can be adapted to ball positions, e.g., following ball positions

The number of vias in each via structure can be changed and adapted to a desired current level for the current CF.

In principle, n power layers may facilitate providing a maximum number n of steps, within the framework of a regular structure, e.g., with a same (or similar) number of balls 12 under each step.

Figure 5:
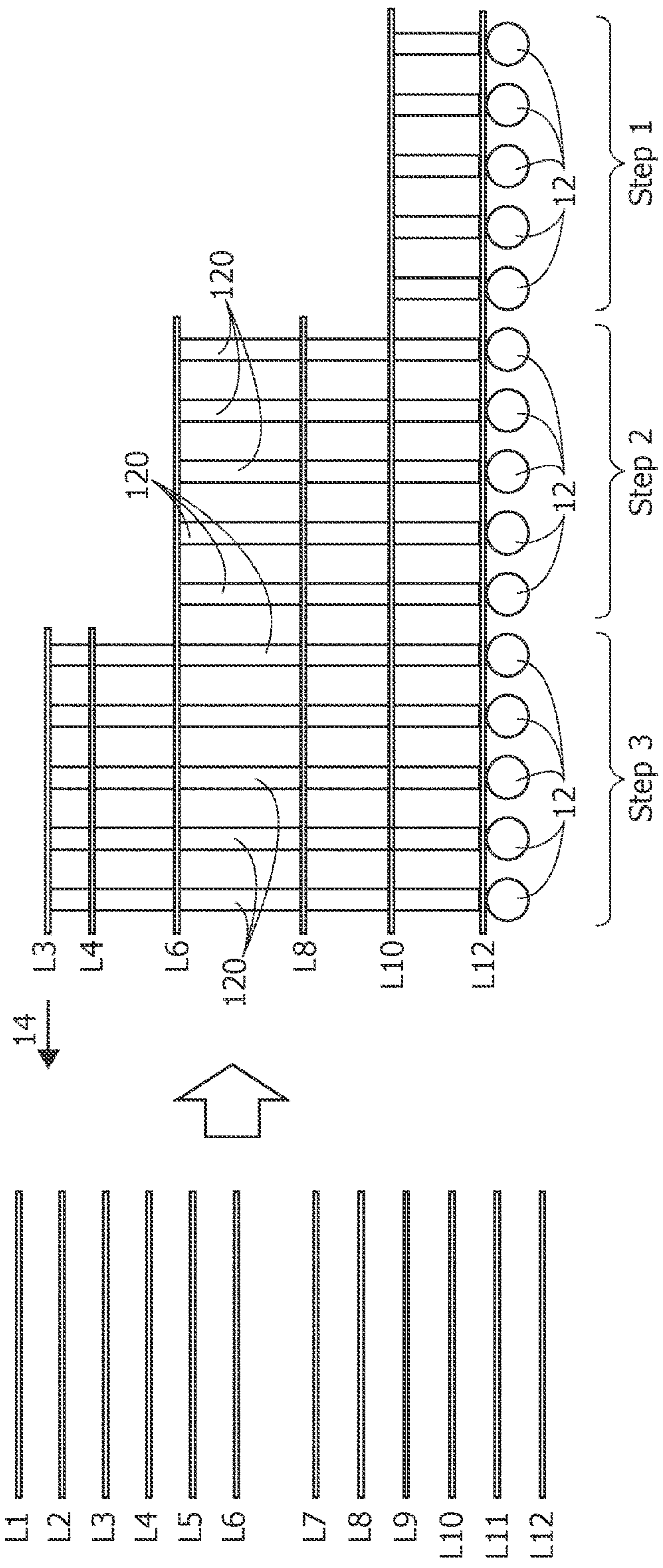
FIG. 5 is exemplary of possible flexibility in implementing the principle underlying solutions described herein as presented in FIGS. 3 and 4.

As represented by way of a further example in FIG. 5, a total number x layers (e.g., L1 to L12) facilitates providing n power layers (n<x) that can be arranged in m steps (m<n)

The value n represents the maximum possible number of steps (one plane for each step).

Steps can be less than that value if they use multiple conductive planes: this may be advantageous in case of current bottlenecks in the horizontal direction.

FIG. 5 is an example showing that the number of steps can be lower than the number of power layers (m<n). This means that the power layers can be grouped (with vias connection) to have multiple layers in each step. By way of example, in FIG. 5, Step 1 uses two layers connected by vias, and the same applies to Step 2 and Step 3.

In other examples (e.g., FIG. 3) a number of steps is exemplified equal to the number of power layers (m=n) and in that case there are no vias above the outermost balls on bottom layer.

Figure 6:
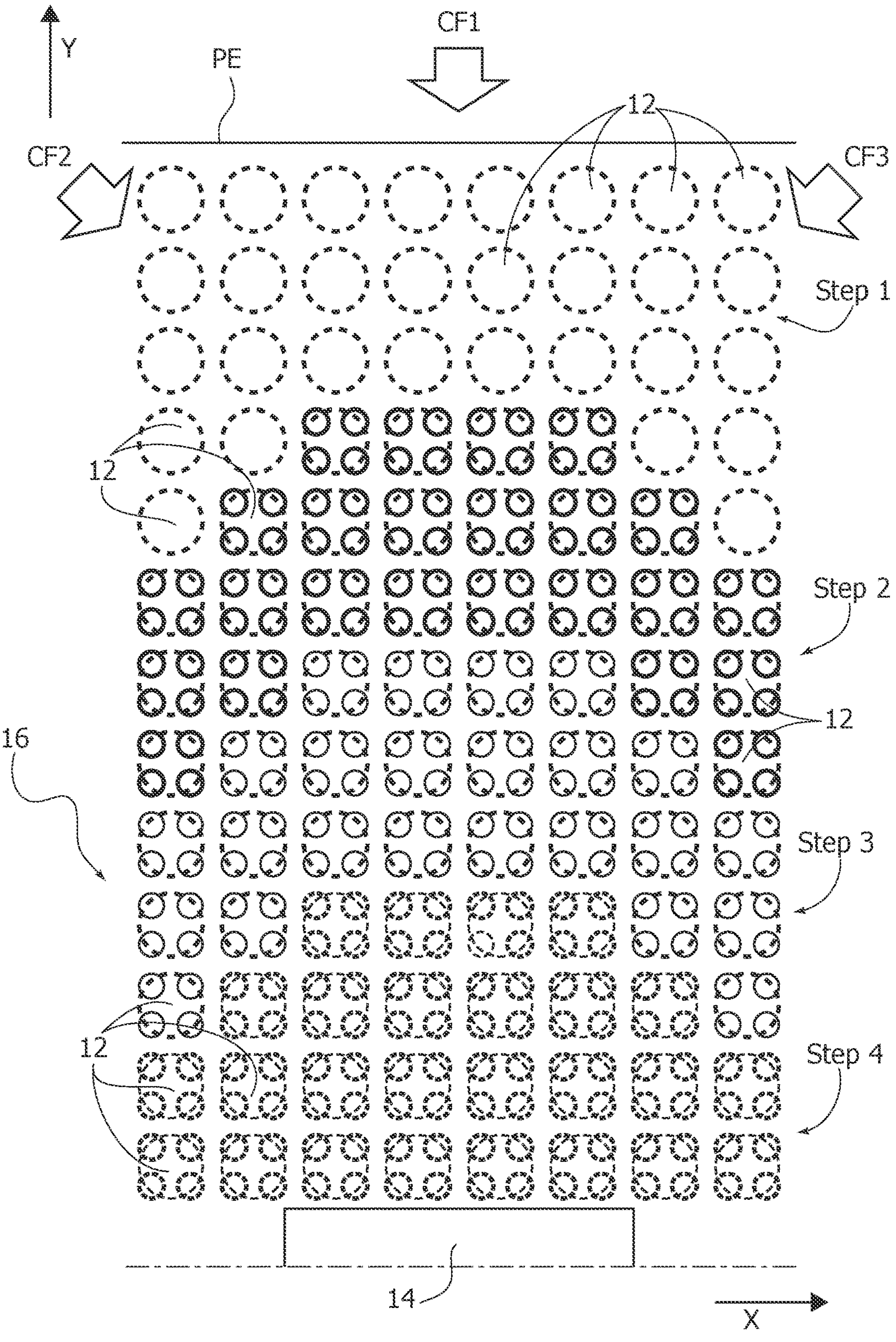
FIGS. 6, 7 and 8 are exemplary of possible variants in implementing the principle underlying solutions as described herein.

FIG. 6 (again, this may be essentially regarded as a plan view of the power channel 16 of FIG. 3 extending between the package edge PE and the die area 14) is exemplary of the possibility of shaping in different ways the steps/conductive planes of the power channel.

In solutions as exemplified in FIG. 4, the steps Step 1, Step 2, Step 3, Step 4 in the stepped arrangement of conductive planes all have (rectilinear) step edges that extend in the X direction, namely cross-wise of the power channel 16, which extends in the Y direction between the peripheral edge PE and the die area 14.

Solutions as exemplified in FIG. 4 thus comprise steps Step 1, Step 2, Step 3, Step 4 the stepped arrangement having at least one (rectilinear) step edge extending cross-wise of the power channel 16.

Conversely, the steps Step 2, Step 3, Step 4 in the stepped structure exemplified in FIG. 6 have polygonal step edges comprising plural edge portions perpendicular to currents CF1, CF2, CF3 (three are shown by way of the example, but can be less or more numerous) flowing towards the die area 14 from different directions.

Steps visible in FIG. 6 comprise: Step 1=one conductive plane with no vias; Step 2=two conductive planes connected by vias; Step 3=three conductive planes connected by vias; and Step 4=four conductive planes connected by vias.

It will be noted that Steps 2, Step 3, and Step 4 has outer edges with a central protruding portion that extends in the X direction (orthogonal to the current CF1) and two lateral portions that extends inclined to the X direction (orthogonal to the currents CF2 and CF3).

That is, in the solution exemplified in FIG. 6, the power channel 16 is configured to convey power supply currents to the semiconductor die (die area 14) from different current inflow directions (e.g., CF1, CF2, CF3), and the steps Step 2, Step 3, Step 4 have (each) a plurality of edge portions extending cross-wise of respective ones of the different current inflow directions CF1, CF2, CF3.

The via distribution can follow the shape(s) of the conductive planes.

In a solution as exemplified in FIG. 6, the power channel 16 is configured to convey power supply currents to the semiconductor die from different current inflow directions CF1, CF2, CF3 and the stepped arrangement of the power channel comprises steps such as Step 2, Step 3, and Step 4 having plural edge portions extending cross-wise of respective ones of the different current inflow directions CF1, CF2, CF3.

A solution as exemplified in FIG. 6 is advantageous in the case of multiple voltage regulators mounted on a PCB and/or to match specific shapes of PCB conductive planes.

Figure 7:
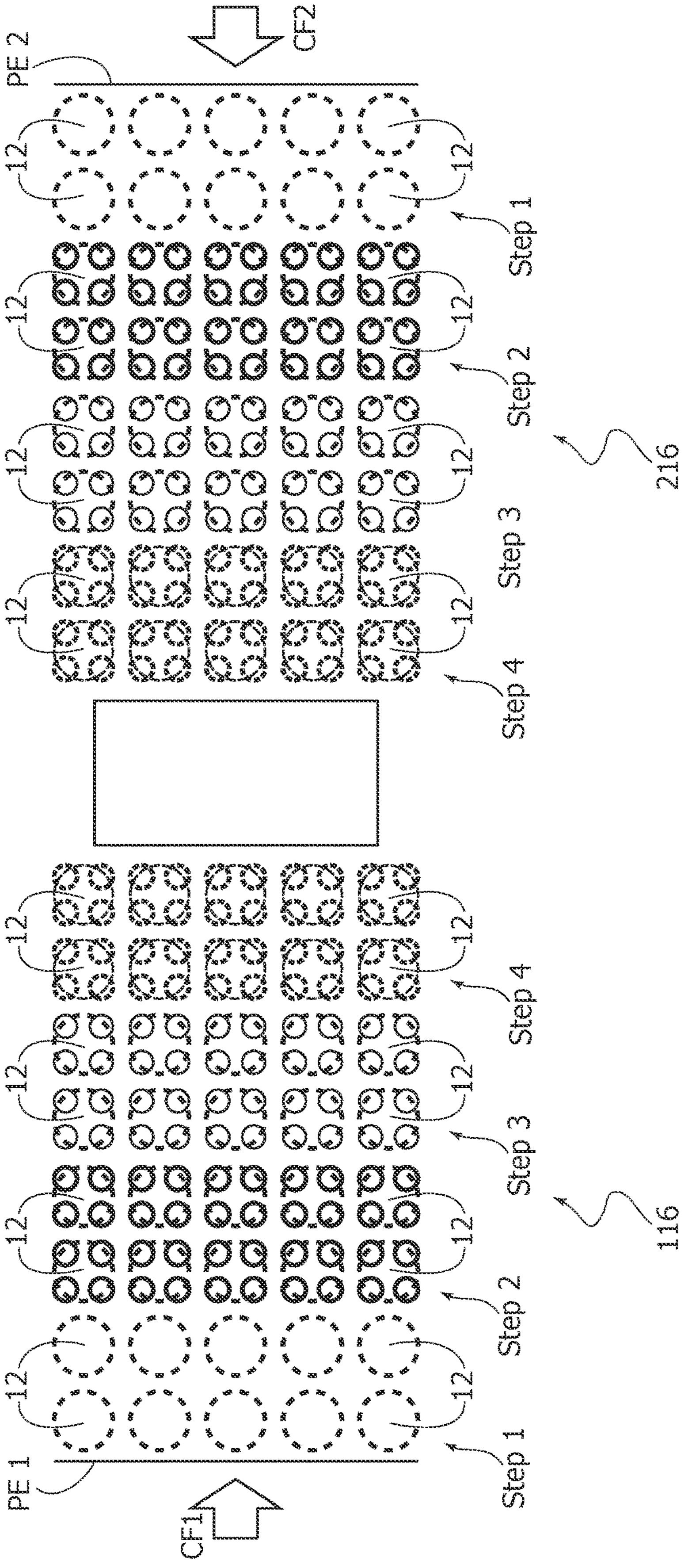

FIG. 7 is exemplary of a solution where multiple (two or more) power channel branches 116, 216 are implemented extending between opposed package edges PE1, PE2 and the die area 14 to convey thereto currents CF1, CF2.

FIG. 7 is thus again exemplary of a solution where the power channel 16 is configured (e.g., duplicated in two branches 116 and 216) to convey power supply currents to the semiconductor die from different current inflow directions, namely CF1 and CF2.

Here again the steps Step 1, Step 2, Step 3, Step 4 in the stepped arrangement(s) of FIG. 7 have edges extending cross-wise of respective ones of the different current inflow directions CF1 and CF2.

Again, a stepped structure is associated to each branch 116, 216 with each branch 116, 216 including: Step 1=one conductive plane with no vias; Step 2=two conductive planes connected by vias; Step 3=three conductive planes connected by vias; and Step 4=four conductive planes connected by vias.

While illustrated here as having a same structure, the branches 116, 216 may have different structures (e.g., number and arrangement of steps).

A solution as exemplified in FIG. 7 can again be advantageous in the case of multiple voltage regulators mounted on a PCB and/or to match specific shapes of PCB conductive planes.

Partitioning the power channel 16 in multiple branches (e.g., 116, 216) also facilitates optimizing ball-out assignment.

FIG. 7 is thus exemplary of a semiconductor device 10 comprising a plurality of power channels 116, 216 to convey power supply currents CF1, CF2 to the semiconductor die area 14 with the power channels 116, 216 extending each between a distal end at the periphery (peripheral edges PE1 and PE2) of the package 10 and a proximal end at the die area 14.

In the solution of FIG. 7, both power channels (branches 116, 216) comprise stacks of electrically conductive planes 12A between a current inflow plane opposite the die area 14 of the package and a current outflow plane towards the die area 14.

Associated distributions of electrically conductive balls 12 comprise electrically conductive balls coupled to the current inflow (bottom) plane of the power channels 116, 216 opposite the current outflow (top) plane near the die area 14.

The power channels (branches) 116, 216 provide current conduction paths towards the die area 14 for such distributions of electrically conductive balls 12.

Again, adjacent electrically conductive planes in the stacks of the power channels 116, 216 are electrically coupled with electrically conductive vias 120 extending therebetween.

Also, in the "duplicated" arrangement of FIG. 7, the conductive planes are stacked in a stepped arrangement (namely Step 1, Step 2, Step 3, Step 4) with the number of stacked conductive planes increasing in steps in the direction from the distal end (peripheral edges PE) to the proximal end (near the die area 14) of the power channels 116, 216.

In the "duplicated" arrangement of FIG. 7, the electrically conductive planes in the stacks of the power channel(s) 116, 216 have respective lengths in the direction from the distal end to the proximal end of (each) power channel branch and these respective lengths decrease from the current inflow plane towards the current outflow plane.

In both branches 116, 216 the current conduction paths towards the die area 14 have resistance values that decrease from the distal ends to the proximal ends of the of the power channels 116, 216.

In that way, the currents CF1, CF2 are more evenly distributed over the current conduction paths from the balls 12 towards the die area 14.

Figure 8:
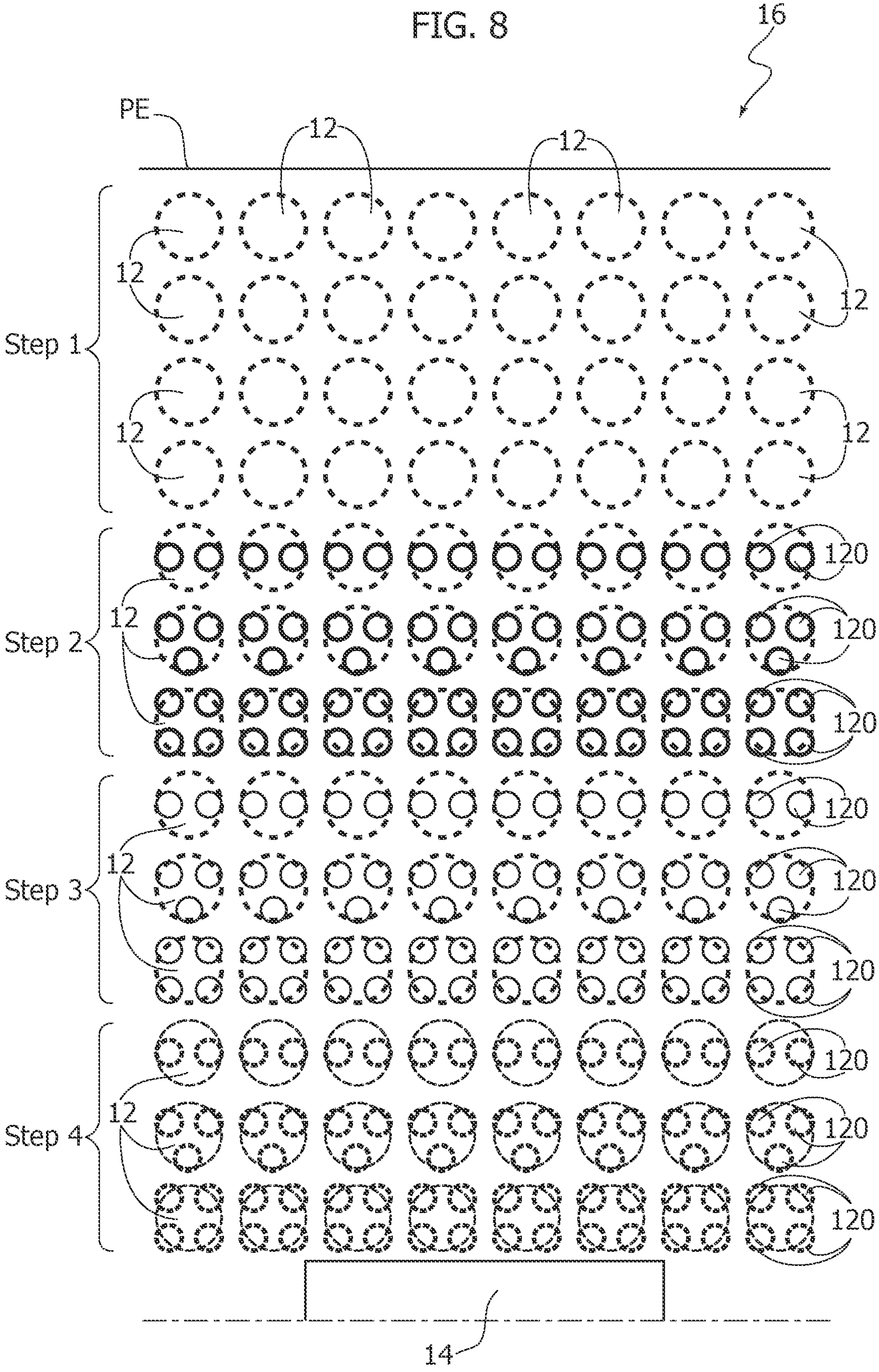

FIG. 8 is exemplary of further flexibility admitted in implementing the solution disclosed herein.

Again, a solution as illustrated in FIG. 8 includes: Step 1=one conductive plane with no vias; Step 2=two conductive planes connected by vias; Step 3=three conductive planes connected by vias; and Step 4=four conductive planes connected by vias.

In the solution exemplified in FIG. 8, in those steps provided with vias (e.g., Step 2, Step 3 and Step 4) the number of vias 120 increases from the step edge to the center of the package, e.g., two vias 120 per ball 12, three vias 120 per ball 12, four vias 120 per ball 12, which results in a (progressive) resistance decrease also within each single step.

That is, in the solution exemplified in FIG. 8, in those steps (e.g., Step 2, Step 3, Step 4) in the stepped arrangement that are coupled with electrically conductive vias 120 (that is, have vias 120 coming down to them) and have at least one step edge, the number of these electrically conductive vias 120 increases with the distance from the step edge.

The solution exemplified in FIG. 8 facilitates a finer control of resistance variation, and the total number of vias 120 per ball 12 can again be selected based on the envisaged current level.

To summarize, solutions as described herein facilitate re-distributing current (e.g., the current CF) in the balls 12 in a power channel 16.

Solutions as described herein may provide about 50% reduction of current peaks in the outermost balls row (e.g., 162) of a BGA package, with a three-fold increase of the current carried by the balls in the center of the channel (i.e., in an intermediate position between the package edge and the die area).

Especially in high-power applications, solutions as described herein facilitate avoiding undesired current peaks on outermost balls that may violate specifications on maximum current per ball.

In low-power applications, solutions as described herein can provide optimization by reducing (minimizing) local current density.

A uniform current distribution among balls in solutions as described herein facilitates minimizing the number of balls dedicated to a same power supply, thus optimizing package size and substrate stack-up while also reducing the overall package cost.

Solutions as described herein apply vertical connections (e.g., vias 120) for power channel implementation reducing in a progressive manner plane size, thus saving area for the rest of the package layout.

Solutions as described herein facilitate resorting to standard design and electrical modeling tools, using standard package stack-up and materials within the framework of structures that can be rendered symmetrical and replicable based on design and electrical parameters.

Without prejudice to the underlying principles, the details and embodiments may vary, even significantly, with respect to what has been described by way of example only without departing from the extent of protection.

The claims are an integral part of the technical teaching provided herein in respect of the embodiments.

The extent of protection is determined by the annexed claims.

The invention claimed is:

1. A semiconductor device, comprising:

a semiconductor die mounted at a die area of a package with an array of electrically conductive balls providing electrical contacts for the semiconductor die;

at least one power channel to convey power supply current to the die area, the at least one power channel extending between a distal end at a periphery of the package and a proximal end at a periphery of the die area of the package, wherein the at least one power channel comprises a stack of electrically conductive planes including a current inflow plane opposite the die area of the package and a current outflow plane towards the die area of the package; and a distribution of electrically conductive balls in the array of electrically conductive balls, the distribution comprising electrically conductive balls coupled to the current inflow plane of the at least one power channel, wherein the at least one power channel provides current conduction paths towards the die area of the package for electrically conductive balls in the distribution of electrically conductive balls coupled to the current inflow plane of the at least one power channel;

wherein:

adjacent electrically conductive planes in the stack of electrically conductive planes of the at least one power channel are electrically coupled with electrically conductive vias extending therebetween; and the electrically conductive planes in the at least one power channel are stacked in a stepped arrangement wherein the number of stacked planes in each step of the stepped arrangement increases from step to step in a direction from the distal end to the proximal end of the power channel, wherein said current conduction paths towards the die area of the package have resistance values that decrease from the distal end to the proximal end of the at least one power channel; and each electrically conductive plane in the stack of the at least one power channel has a length in the direction from the distal end to the proximal end of the power channel, wherein the length of each electrically conductive plane in the stack decreases from the current inflow plane towards the current outflow plane of the at least one power channel.

2. The semiconductor device of claim 1, comprising steps in said stepped arrangement having at least one step edge extending cross-wise of the power channel.

3. The semiconductor device of claim 1, wherein:

the at least one power channel is configured to convey power supply currents to the semiconductor die from different current inflow directions; and said stepped arrangement comprises steps having plural edge portions extending cross-wise of respective ones of said different current inflow directions.

4. The semiconductor device of claim 1, further comprising steps in said stepped arrangement coupled with electrically conductive vias and having at least one step edge, wherein the number of said electrically conductive vias increases with the distance from said at least one step edge.

5. The semiconductor device of claim 1, wherein the at least one power channel comprises a plurality of power channels.

6. The semiconductor device of claim 1, wherein the stack of electrically conductive planes comprises:

a first electrically conductive plane in contact with and extending over all electrically conductive balls in the distribution of electrically conductive balls;

a second electrically conductive plane extending over a first subset of the electrically conductive balls in the distribution of electrically conductive balls which is fewer in number than all electrically conductive balls in the distribution of electrically conductive balls; and a third electrically conductive plane extending over a second subset of the electrically conductive balls in the distribution of electrically conductive balls which is fewer in number than the first subset of the electrically conductive balls in the distribution of electrically conductive balls.

7. The semiconductor device of claim 6, wherein the power channel further includes:

first vias electrically connecting the second electrically conductive plane to the first electrically conductive plane; and second vias electrically connecting the third electrically conductive plane to the second electrically conductive plane.

8. The semiconductor device of claim 7, wherein a number of first vias is equal to a number of electrically conductive balls in the first subset, and wherein a number of second vias is equal to a number of electrically conductive balls in the second subset.

9. The semiconductor device of claim 8, wherein the first vias are vertically aligned with the electrically conductive balls in the first subset, and wherein the second vias are vertically aligned with the electrically conductive balls in the second subset.

10. The semiconductor device of claim 6, wherein each of the first, second and third electrically conductive planes extends underneath at least part of the semiconductor die.

* * * * *